United States Patent [19]

Firooz

[11] Patent Number: 5,066,909
[45] Date of Patent: Nov. 19, 1991

[54] APPARATUS FOR TESTING AN ELECTRONIC CIRCUIT HAVING AN ARBITRARY OUTPUT WAVEFORM

[75] Inventor: Kamran Firooz, Loveland, Colo.

[73] Assignee: Hewlett-Packard Company, Palo Alto, Calif.

[21] Appl. No.: 472,505

[22] Filed: Jan. 30, 1990

[51] Int. Cl.⁵ ............... G01R 23/16; G06F 15/31
[52] U.S. Cl. .................... 324/158 R; 324/73.1; 324/121 R; 364/487
[58] Field of Search ........... 324/121 R, 158 R, 103 P, 324/77 A, 606, 689, 705, 679, 720, 73.1; 364/487, 571.01; 340/722, 739; 371/25.1, 15.1

[56] References Cited

U.S. PATENT DOCUMENTS

| | | | |
|---|---|---|---|
| 2,963,652 | 12/1960 | Taylor et al. | 324/121 R |
| 3,505,598 | 4/1970 | Merrill | 324/77 A |
| 4,262,255 | 4/1981 | Kokei et al. | 324/103 P |
| 4,641,246 | 2/1987 | Halbert et al. | 324/121 R |
| 4,694,402 | 9/1987 | McEachern et al. | 364/487 |
| 4,713,771 | 12/1987 | Crop | 364/487 |
| 4,791,357 | 12/1988 | Hyduke | 371/25.1 |
| 4,807,147 | 2/1989 | Halbert et al. | 324/77 A |
| 4,807,161 | 2/1989 | Comfort et al. | 364/571.01 |
| 4,809,189 | 2/1989 | Batson | 324/121 R |
| 4,868,496 | 9/1989 | Havel | 364/487 |

Primary Examiner—Kenneth A. Wieder
Assistant Examiner—Vinh P. Nguyen

[57] ABSTRACT

Disclosed is a test system having an arbitrary waveform generator, a comparator, and a test controller to analyze the arbitrary signal output from a device under test. The output of the device under test is connected to one input of the comparator and the output of the arbitrary waveform generator is connected to the other input of the comparator. The test controller stimulates the device under test, causing it to perform a function, and stimulates the arbitrary waveform generator, causing it to generate a limit envelope signal. The output of the comparator is continuously monitored by the test controller to determine whether the signal output of the device under test exceeds the limit envelope created by the arbitrary waveform generator.

12 Claims, 4 Drawing Sheets

APPARATUS FOR TESTING AN ELECTRONIC CIRCUIT HAVING AN ARBITRARY OUTPUT WAVEFORM

FIELD OF THE INVENTION

This invention relates to electronic circuit testing, including testing of circuit output waveforms and in-circuit testing of an arbitrary waveform output of an electronic circuit.

BACKGROUND OF THE INVENTION

It is important that electronic components and printed circuit boards be tested after the components have been soldered to the printed circuit boards. Several different approaches have been developed for testing the components and printed circuit boards, including functional testing, and in-circuit testing.

Functional testing uses a procedure of applying predetermined input signals and monitoring the output of a printed circuit board to determine if all of the components are present and operating properly on the circuit board. Because of limitations encountered when testing an entire PC board, such as difficulty in isolating a failing component, in-circuit testing techniques have been developed to individually test the components on a PC board to determine if these components are working properly. This process uses a "bed of nails" tester to access each individual component and test that component separately. In this manner, non-functioning components can be identified and replaced to prevent the entire circuit board from being scrapped.

Both of these techniques must stimulate the input to an electronic circuit or component and then analyze the output of the circuit or component. In the case of digital circuits or components, the output can be evaluated as a series of high or low signals representing binary ones and zeros. In the case of analog circuits, however, measuring and analyzing the output is much more difficult.

Prior art systems have measured the analog output of a circuit by using a digitizer to sample the output and then processing the digitized output using a microprocessor or other sequencer. This technique has several limitations. The frequency that can be measured is limited by the capability of the analog to digital converters used to convert a signal into digital form, as well as the amount of memory necessary to store the digitized data before processing. Another limitation is the cost of the sampling equipment, especially if multiple signals are being sampled simultaneously. The most severe limitation, however, is the time necessary to process the digitized data and determine if the output was within specified limits. Furthermore, the amount of time required is directly proportional to the accuracy desired, often requiring several seconds for processing thus making real time analysis impossible.

There is a need in the art then for a system that will directly analyze the output of an electronic circuit. There is also a need for such a system that will perform such analysis in real time. A further need is for such a circuit that is economical to produce. Still another need is for such a circuit that can analyze high speed signals.

SUMMARY OF THE INVENTION

It is an object of the present invention to provide a method and apparatus to directly analyze the output of an analog or digital circuit.

It is another object of the invention to provide such an apparatus and method that tests such output in real time.

Yet another object of the invention is to provide such apparatus and method to test an arbitrary waveform having an irregular pattern.

A further object of the invention is to provide such an apparatus and method that is simple and economical.

A still further object is to provide such an apparatus and method that will test such an output at high speed.

The above and other objects are accomplished in a test system having an arbitrary waveform generator, a comparator, and a test controller to analyze the arbitrary signal output from a device under test. The test controller simulates the device under test, to cause it to perform a function, and the output of the device under test is connected to one input of a comparator. At the time that the test controller starts the device under test, it also starts an arbitrary waveform generator whose output is connected to the other input of the comparator. The signal created by the arbitrary waveform generator is a limit which the signal output of the device under test should not exceed. The output of the comparator is continuously tested by the test controller to exceeded the waveform limit created by the arbitrary waveform generator. If the output of the device under test exceeds the limit, then the device under test is in error. The test may be run twice to compare the output to both upper and lower limits to determine whether the waveform output of the device under test fits within an envelope.

In a second embodiment of the device, a pair of arbitrary waveform generators are used to create both the upper and lower envelope limits of the signal output of the device under test. The device under test output is fed to a pair of comparators, one of which receives the lower limit waveform envelope and the other receives the upper limit waveform envelope. By sampling the output of both comparators, the test controller can determine, in a single test, whether the output of the device under test is within the envelope created by the waveform generators.

BRIEF DESCRIPTION OF THE DRAWINGS

The above and other objects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
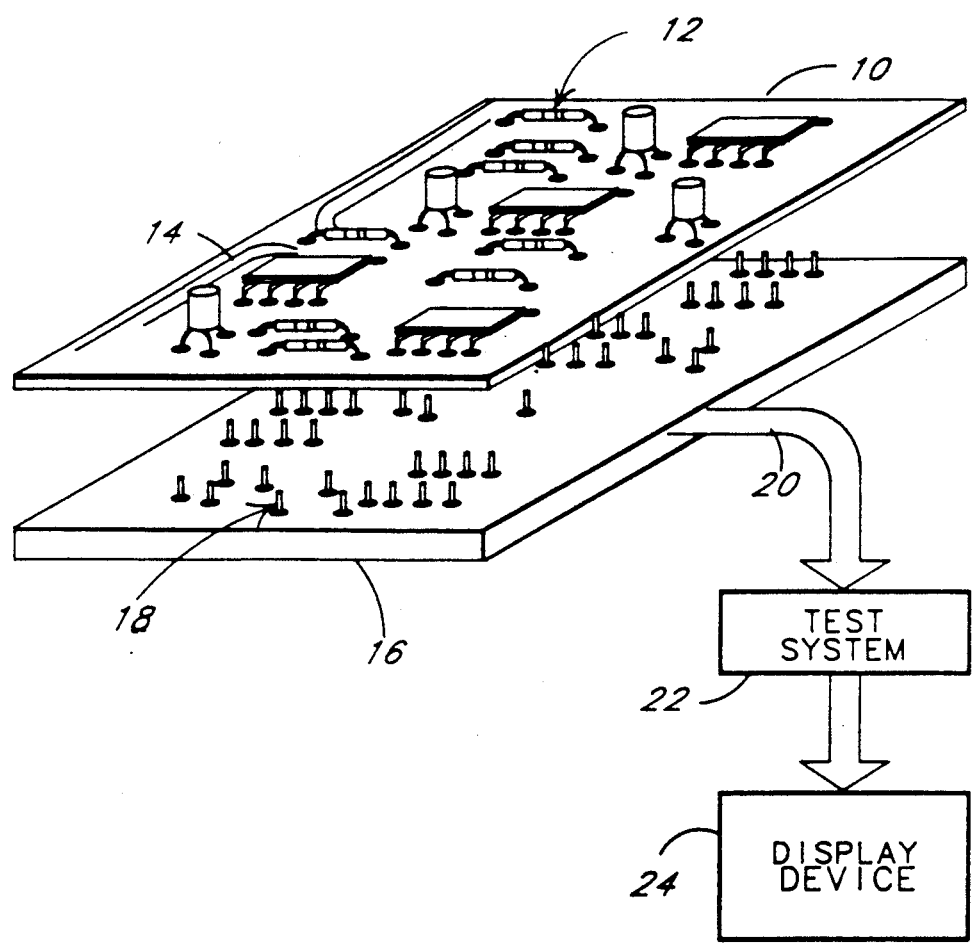
FIG. 1 shows an overview diagram of an in-circuit test apparatus incorporating the present invention.

FIG. 1 shows a schematic overall view of an implementation of the device of the present invention. Referring now to FIG. 1, printed circuit board 10 has a plurality of both analog and digital components 12 connected by way of their component leads through a plurality of conductors 14 that form a circuit on the printed circuit board 10. Test bed 16 has a plurality of connector pins 18 that function to contact conductors 14 at predetermined locations to apply test signals and detect responses at predetermined locations within printed circuit board 10. Conductors 20 connect the connector pins 18 to test system 22. Test system 22 includes the necessary signal generators and signal processing equipment to perform the operations and analysis of the present invention and provide display information for display device 24 to indicate any defects that may exist in the circuit of printed circuit board 10.

Figure 2:
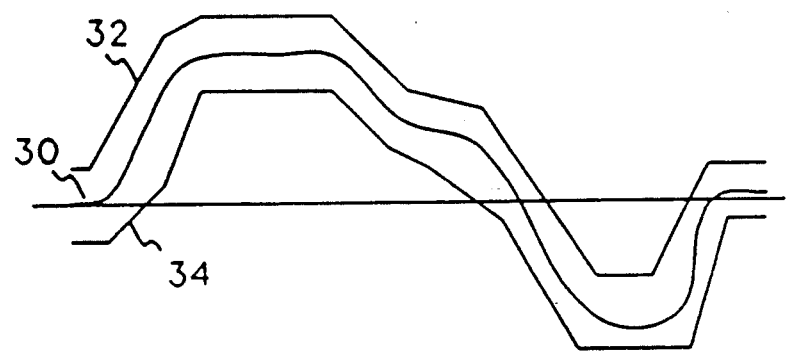
FIG. 2 is a diagram of a waveform showing the desired envelope limit surrounding the waveform.

FIG. 2 shows a diagram of a waveform and the desired envelope limit surrounding the waveform. Referring now to FIG. 2, the output waveform 30 of a device under test should be contained within the limits defined by an upper envelope 32 and a lower envelope 34. Although the output of a circuit may not be a smooth signal, the envelope that defines the limits of that output is usually a well-defined, smooth signal.

To determine whether the output signal 30 of the device under test stays within the limits defined by the envelope 32 and 34, the present invention connects the output signal 30 to one input of a comparator, and one of the envelope limits 32 or 34 to the other input of the comparator. The output of the comparator is monitored to determine if the output signal exceeded the envelope limit. The other envelope is then connected to the comparator and the circuit under test is started again. The output of the comparator is monitored a second time to determine if the output signal exceeds the second envelope. If the output signal stays within both envelopes, the circuit passes. If the output signal exceeds either envelope, the circuit fails.

In a second embodiment, the invention connects the output 30 to inputs of a pair of comparators, connects the upper limit 32 into the other input of one of the comparators and lower limit 34 into the other input of the other comparator. The test controller then stimulates the circuit under test. If either comparator indicates an error, then the signal 30 has exceeded the limits defined by the envelope 32 and 34, and fails the test.

Figure 3:
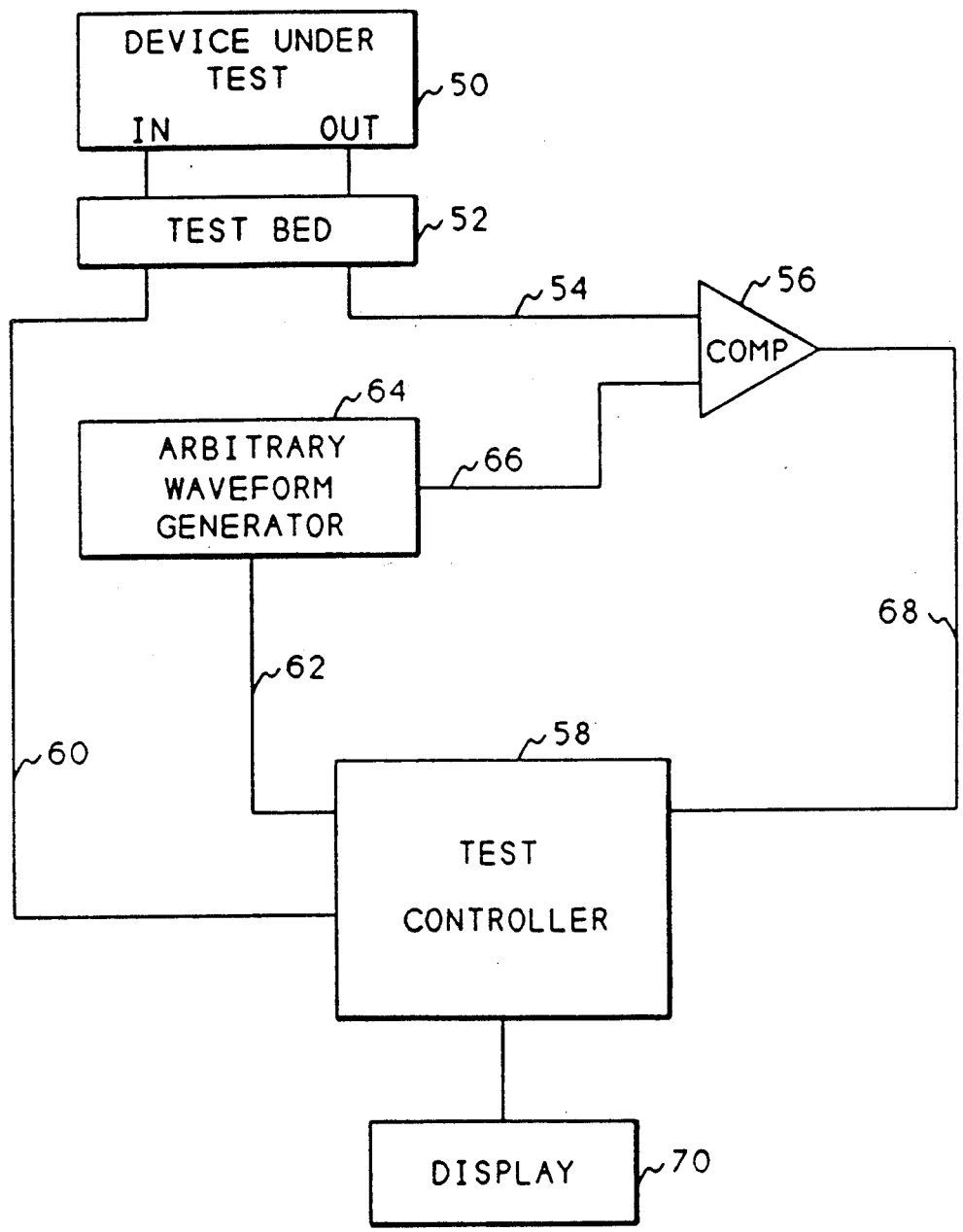
FIG. 3 is schematic block diagram of the invention showing a single waveform generator.

FIG. 3 shows a schematic block diagram of the invention including a single waveform generator and comparator. Referring now to FIG. 3, a device under test 50 is positioned on a test bed 52. An output 54 of the device under test passes through the test bed 52 and is connected to a comparator 56. A test controller 58 generates a stimulus 60 which activates the device under test and causes it to create the output 54. The test controller 58 also sends a stimulus 62 which activates an arbitrary waveform generator 64 causing it to produce an output envelope 66. The output 54 of the device under test and the output envelope 66 of the arbitrary waveform generator 64 are compared by the comparator 56 whose output 68 is fed back to the test controller 58. As described above with reference to FIG. 2, the output envelope 66 of the arbitrary waveform generator represents one of the limits of the output 54 of the device under test 50. If the output 54 exceeds the limit 66, the output 68 of the comparator 56 will cause the test controller to generate an error on the display 70.

If the test requires that the output 54 of the device under test 50 must be between both upper and lower limits, the test controller can test the device 50 twice, on the first test the test controller would cause the arbitrary waveform generator to create an upper limit envelope, and on the second test the test controller 58 would cause the arbitrary waveform generator 64 to create the lower limit envelope. In this manner, the output 54 of the device under test 50 can be tested to insure that it falls within an upper and lower limit.

Figure 4:
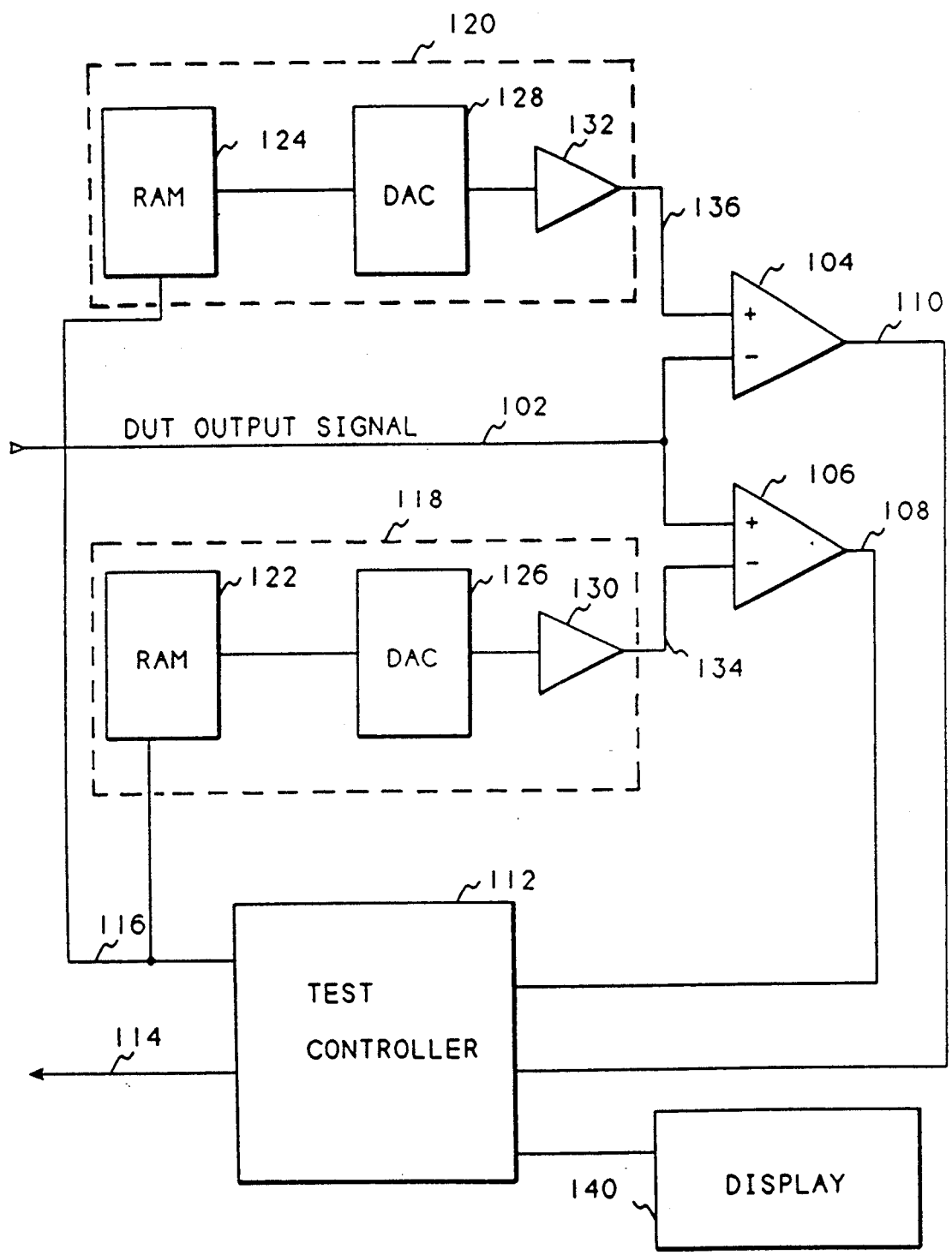
FIG. 4 is a schematic block diagram of the present invention showing two waveform generators.

FIG. 4 shows an alternative embodiment of the present invention, incorporating a pair of waveform generators and a pair of comparators to test both limits of the output signal simultaneously. Referring now to FIG. 4, a DUT output signal 102 is connected to a pair of comparators 104 and 106. The outputs 108 and 110 of the comparators 104 and 106 are connected to a test controller 112. The test controller 112 produces a stimulus 114 which is fed to the device under test (not shown). The device under test (not shown) creates an output which is returned as the DUT output signal 102. When the test controller 112 sends the stimulus 114 to the device under test, it also sends a stimulus 116 to a pair of arbitrary waveform generators 118 and 120. The waveform generators 118 and 120 each contain a random access memory (RAM) 122, 124 which is connected to a digital to analog converter (DAC) 126, 128. The output of the DAC is connected to an amplifier 130, 132 which creates output signals 134 and 136 respectively.

The test controller 112 loads data into the RAMs 122 and 124 prior to stimulating the device under test. After stimulating the device under test, the test controller 112 controls the rate at which data is read from the random access memories 122 and 124 and fed to the DACs 126 and 128. By controlling the initial data in the random access memories, and by controlling the rate at which the data is read from the random access memories, the test controller can cause an arbitrarily shaped waveform to be created by the two waveform generators 118 and 120. Typically the test controller 112 would program one of the arbitrary waveform generators to create a waveform representing the upper limit envelope of the waveform under test, and program the other of the waveform generators to create a waveform that represents the lower limit envelope of the signal being tested. In this manner the test controller can test the upper and lower limits of the test signal simultaneously. If either the upper or the lower limit of the test signal is exceeded, one of the comparators 104 or 106 will indicate an error condition, and the test controller will then display an error message on the display 140.

Having thus described a presently preferred embodiment of the present invention, it will now be appreciated that the objects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A system for testing an arbitrary output waveform of a device under test, said system comprising:

waveform generator means for creating a continuous output limit waveform comprising data storage means for storing a predetermined limit waveform, and means for retrieving said continuous output limit waveform from said data storage means;

comparator means for dynamically comparing said device under test output waveform to said continuous output limit waveform and for generating an error signal if said device under test output waveform exceeds said output limit waveform; and controller means for stimulating said device under test and said waveform generator and for detecting said error signal.

2. The system of claim 1 wherein said means for retrieving further comprises digital to analog converter means for converting an output of said data storage means to an analog output limit waveform.

3. The system of claim 2 further comprising data bus means for transferring data from said controlled means to said data storage means.

4. The system of claim 1 further comprising means for displaying an indicator when said error signal is detected.

5. A system for testing an arbitrary output waveform of a device under test, said system comprising:

first waveform generator means for creating an upper output limit waveform;

second waveform generator means for creating a lower output limit waveform;

first comparator means for comparing said device under test output waveform to said generator upper output limit waveform and for generating a first error signal when said device under test output exceeds said upper limit output;

second comparator means for comparing said device under test output to said generator lower output limit waveform and for generating a second error signal when said device under test output exceeds said lower limit output; and controller means for stimulating said device under test and said first and second generators and for detecting said first and second error signals.

6. The system of claim 5 wherein said first and second waveform generators each comprise:

data storage means; and digital to analog converter means for converting an output of said data storage means to said output limit waveforms.

7. The system of claim 6 further comprising data bus means for transferring data from said controller means to said data storage means.

8. The system of claim 5 further comprising means for displaying an indicator when either said first or second error signals is detected.

9. A system for testing an arbitrary output waveform of a device under test, said system comprising:

waveform generator means for creating an output limit waveform comprising a data storage means for storing a predetermined limit waveform, and means or retrieving said output limit waveform from said data storage means;

comparator means for comparing said device under test output waveform to said output limit waveform and for generating an error signal if said device under test output waveform exceeds said output limit waveform; and controller means for stimulating said device under test and said waveform generator and for detecting said error signal.

10. The system of claim 9 wherein said means for retrieving further comprises digital to analog converter means for converting an output of said data storage means to an analog output limit waveform.

11. The system of claim 10 further comprising data bus means for transferring data from said controller means to said data storage means.

12. The system of claim 9 further comprising means for displaying an indicator when said error signal is detected.

* * * * *